(12) United States Patent
Voltti

(10) Patent No.: US 10,432,189 B2
(45) Date of Patent: Oct. 1, 2019

(54) CONTROL OF SEMICONDUCTOR SWITCH

(71) Applicant: VACON OY, Vaasa (FI)

(72) Inventor: Pasi Voltti, Vaasa (FI)

(73) Assignee: VACON OY, Vaasa (FI)

( * ) Notice: Subject to any disclaimer, the term of this patent is extended or adjusted under 35 U.S.C. 154(b) by 0 days.

(21) Appl. No.: 15/578,307

(22) PCT Filed: Jun. 21, 2016

(86) PCT No.: PCT/EP2016/064240
§ 371 (c)(1),
(2) Date: Nov. 30, 2017

(87) PCT Pub. No.: WO2016/207126
PCT Pub. Date: Dec. 29, 2016

(65) Prior Publication Data
US 2018/0152184 A1 May 31, 2018

(30) Foreign Application Priority Data
Jun. 25, 2015 (FI) .................................. 20154128 U

(51) Int. Cl.
H03K 17/687 (2006.01)
H03K 17/16 (2006.01)
(Continued)

(52) U.S. Cl.
CPC ............ *H03K 17/168* (2013.01); *H02M 1/08* (2013.01); *H03K 17/0828* (2013.01);
(Continued)

(58) Field of Classification Search
CPC ............ H03K 17/063; H03K 17/0822; H03K 17/04123; H03K 2217/0036; H03K 17/687
(Continued)

(56) References Cited

U.S. PATENT DOCUMENTS 6,845,022 B2 * 1/2005 Yoshimura .......... H02M 7/5387
363/95
7,274,243 B2 * 9/2007 Pace .................... H02M 7/538
327/396
(Continued)

FOREIGN PATENT DOCUMENTS

JP 2001-286124 A 10/2001
JP 2004-159467 A 6/2004
JP 2012-10566 A 1/2012

OTHER PUBLICATIONS

International Search Report for PCT Serial No. PCT/EP2016/064240 dated Aug. 24, 2016.

*Primary Examiner* — Anh Q Tra
(74) *Attorney, Agent, or Firm* — McCormick, Paulding & Huber LLP

(57) ABSTRACT

Arrangement for controlling a voltage signal between gate and emitter terminals (G-E) of a switch type power semiconductor component, such as an IGBT transistor, such that the voltage signal is formed at least partly by means of a resistance and a switch ($R_{GON1}$-$S_{GON1}$, $R_{GOFF1}$-$S_{GOFF1}$) connected in series between an auxiliary voltage ($+U_{G4}$, $-U_{G4}$) of a gate controller and the gate terminal (G) of the IGBT. The arrangement is adapted to control the switch ($S_{GON1}$, $S_{GOFF1}$) with a high frequency of at least 1 MHz and with a duty cycle adjusted such that the measured rate of change of a collector voltage of the IGBT being controlled is set in accordance with a reference value received from a control unit of the device.

8 Claims, 2 Drawing Sheets

(51) Int. Cl.
  *H02M 1/08* (2006.01)
  *H03K 17/082* (2006.01)
  H02M 7/5387 (2007.01)
  H02M 1/00 (2006.01)
  H02M 5/458 (2006.01)

(52) U.S. Cl.
  CPC ........ *H02M 5/4585* (2013.01); *H02M 7/5387* (2013.01); *H02M 7/53871* (2013.01); *H02M 2001/0029* (2013.01)

(58) Field of Classification Search
  USPC .................................................. 327/427, 434
  See application file for complete search history.

(56) References Cited

U.S. PATENT DOCUMENTS

| | | |
|---|---|---|
| 8,558,491 B2 | 10/2013 | Kuwabara et al. |
| 9,685,955 B2 * | 6/2017 | Choi .............. H03K 19/017518 |
| 2008/0204087 A1 * | 8/2008 | Schwarzer ......... H03K 17/0828 327/109 |
| 2009/0237052 A1 | 9/2009 | Takasu et al. |
| 2014/0015571 A1 * | 1/2014 | Wagoner ................ H03K 17/14 327/109 |
| 2015/0155700 A1 * | 6/2015 | Alvarez Valenzuela ..................... H02H 3/08 361/93.9 |
| 2015/0162902 A1 * | 6/2015 | Lizama ................ H03K 17/082 327/376 |

* cited by examiner

CONTROL OF SEMICONDUCTOR SWITCH

CROSS-REFERENCE TO RELATED APPLICATIONS

This application is a National Stage application of International Patent Application No. PCT/EP2016/064240, filed on Jun. 21, 2016, which claims priority to Finnish Patent Application No. U20154128, filed on Jun. 25, 2015, each of which is hereby incorporated by reference in its entirety.

TECHNICAL FIELD

The present invention relates to control of a power semiconductor switch, in particular an arrangement for optimising power losses and the connection speed of an IGBT (insulated-gate bipolar transistor) used in a power electronic device such as a frequency converter.

BACKGROUND ART

A core objective of a system for controlling a power electronic device such as a frequency converter is to control output current appropriately for control of an external load, e.g. for regulation of rotation speed of an electric motor, and at the same time in such a way that power components used on the current path are not subjected to excessive strain.

IGBTs are switch type power semiconductor components, which are used widely in main circuit solutions which handle the load current of power electronic devices. An IGBT is a gate-controlled component, meaning that it can be switched to a conducting/non-conducting state by a voltage signal inputted to the gate terminal. An IGBT is a favourable component for power electronic devices, because its fast response time to a control signal enables the control system of a device to control load current with sufficient precision.

The gate voltage controlling an IGBT refers to the voltage between the gate and emitter terminals. Fast control to make the IGBT conduct means that the internal gate capacitance of the IGBT is charged rapidly to a sufficient positive voltage level, and correspondingly, fast control to make the IGBT non-conducting requires rapid release of the capacitance charge to close to zero level. Normally, the gate voltage is controlled to be negative in the standby state; this is unnecessary from the point of view of component control, but increases the margin of certainty against external interference.

It is known that the rapid changes in voltage associated with IGBT connection events can cause interference emissions which move from the device to the environment by conduction and radiation. In the context of long cables, it is known that output voltage pulses with steep edges are reflected at the other end of the cable in accordance with transmission line theory due to a difference in impedance, giving rise to overvoltage spikes which put a strain on motor insulators. Rapid voltage changes also give rise to capacitive current pulses which put a strain on motor bearings.

The connection speed of an IGBT, and therefore also the severity of interference issues as well as so-called connection losses, can be influenced by how fast the gate capacitance is charged and discharged. A direct control circuit of an IGBT, called a gate controller, usually contains at least one positive and at least one negative DC voltage circuit, either one of which is connected to the gate via resistances according to control commands issued by a control unit of the device. The ohm values of these so-called gate resistances can influence the IGBT's connection speed and thereby in turn influence the device's interference levels and internal losses.

Patent publication U.S. Pat. No. 8,558,491 presents a solution in which the ohm value of a gate resistance in use can be changed according to the operating state of an inverter. The operating state is defined on the basis of a measured output current and a measured DC voltage of an intermediate circuit, and the gate resistances of all the IGBTs are changed simultaneously. By means of the solution, the gate resistance value can be optimised at some operating points, but by the same principle, optimisation at many points leads to an unfavourable solution, due to the large number of resistance selecting switches, etc.

SUMMARY

The object of the present invention is to implement a novel arrangement, by means of which the abovementioned drawbacks are avoided and a gate controller solution is achieved by which the gate capacitance can be charged and discharged at a desired speed. In the solution, the value of the effective gate resistance can be adjusted in a stepless manner, despite the fact that the number of physical resistances and selecting switches thereof is small. The object of the invention is achieved by means of an arrangement characterised by what is stated in the characterising part of the independent claim. The other advantageous embodiments of the invention are the subject of the dependent claims.

An application of the invention may for example be a frequency converter based on an IGBT-based main circuit, for which reason this is used as an example in the description and claims of the invention. However, the invention is not limited merely to frequency converters or to the control of an IGBT, but may be applied to the control of power semiconductor switches of other types, such as power MOSFETs.

The invention is characterised in that an IGBT-specific gate controller comprises at least one resistance, and a switch connected in series therewith which can connect the resistance between a gate terminal of an IGBT and an auxiliary voltage of the gate controller, and which switch is controlled with a high frequency of at least 1 MHz.

According to one embodiment of the invention, the duty cycle of the abovementioned switch (=the length of time for which the switch is conducting/the entire operating period) depends on the measured rate of change of the collector voltage of the IGBT being controlled.

According to one embodiment of the invention, the abovementioned switch and the resistance connected in series therewith are connected in parallel with a gate resistance that is connected between the IGBT's gate terminal and an auxiliary voltage of the gate controller all the time that the IGBT is controlled to be in a conducting state.

According to one embodiment of the invention, the abovementioned switch and resistance are connected in parallel with a gate resistance that is connected between the IGBT's gate terminal and an auxiliary voltage of the gate controller all the time that the IGBT is controlled to be in a non-conducting state.

According to one embodiment of the invention, the gate controller comprises a regulating unit, which adjusts the duty cycle of the abovementioned switch such that the measured rate of change of the collector voltage of the IGBT being controlled is set in accordance with a reference value received from a control unit of the device.

By means of the gate controller solution according to the invention, the effective value of the gate resistance can be adjusted steplessly through the duty cycle of the switch connected in series with the gate resistance. Due to the gate resistance being steplessly adjustable, a gate current that charges/discharges the gate capacitance of the IGBT being controlled can also be adjusted steplessly. In an equilibrium state, this current that is inputted by the gate controller corresponds to a current inputted to the gate via a so-called Miller capacitance by the changing collector voltage, on which circumstance the ability afforded by the invention to steplessly adjust the rate of change of the IGBT's collector voltage in the context of controlling the IGBT to enter both conducting and non-conducting states is based. The number of components required for connection according to the invention is small, so it is also advantageous in terms of costs.

BRIEF DESCRIPTION OF THE DRAWINGS

The invention is explained in more detail below with the aid of examples, with reference to the accompanying drawings, in which.

DETAILED DESCRIPTION

Figure 1:
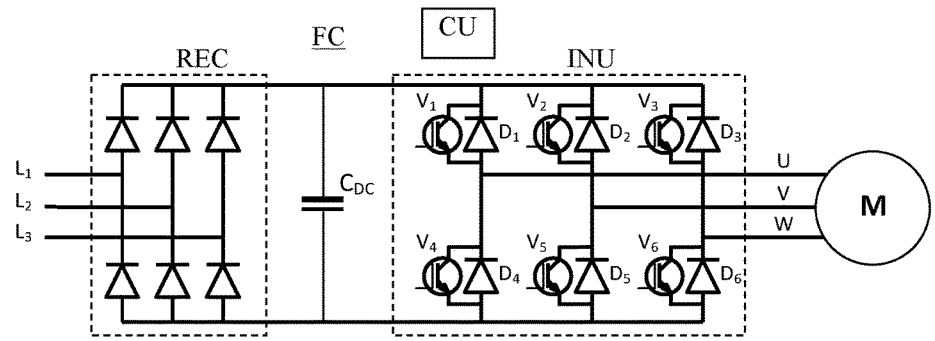
FIG. 1 shows a main circuit of a frequency converter.

FIG. 1 shows an example of a main circuit of a normal PWM (pulse width modulation) frequency converter FC, in which a three-phase network bridge REC composed of diodes rectifies a three-phase AC voltage of an input network connected to input terminals $L_1$, $L_2$ and $L_3$ to an intermediate circuit DC voltage, which is filtered by a filter capacitor $C_{DC}$ functioning as an energy store. An inverter bridge INU realised by power semiconductor components $V_1$-$V_6$ and $D_1$-$D_6$ forms a three-phase output voltage U, V, W from the intermediate circuit DC voltage, to control a motor M. Controlled power semiconductor switches $V_1 \ldots V_6$ in modern frequency converters are usually IGBT transistors as in the example in the figure, with so-called zero diodes $D_1 \ldots D_6$ being connected in parallel therewith. A control unit CU controls the operation of the device. Normally an inductive component is connected to either side of the network bridge in order to filter harmonics of a network current taken by the frequency converter, but it is insignificant in the context of the present invention and therefore not shown in the figure.

Figure 2:
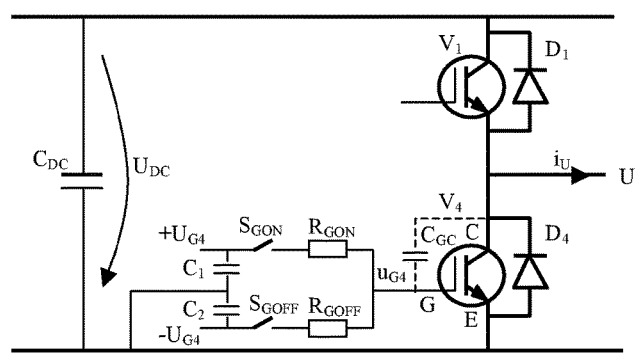
FIG. 2 shows a gate control arrangement of an IGBT.

FIG. 2 shows one changeover switch of a frequency converter, composed of power components $V_1$ and $D_1$ in an upper branch and power components $V_4$ and $D_4$ in a lower branch. The changeover switch can connect either pole of the DC voltage intermediate circuit to an output terminal U, regardless of the direction of an output current $i_U$.

The figure also shows some details of an IGBT and typical control circuit principles thereof, in the case of IGBT $V_4$. $C_{GC}$ is the internal, so-called Miller capacitance of the IGBT, which has a fundamental effect on the connection event of the IGBT. $+U_{G4}$ and $-U_{G4}$ are auxiliary voltages of the gate controller, the sizes of which are normally about +15 Vdc and −15 Vdc with respect to the emitter terminal E of the IGBT. The IGBT is controlled to enter a conducting state (the current path between the collector and emitter terminals) by the switch $S_{GON}$ connecting the gate terminal G to the positive auxiliary voltage $+U_{G4}$ via gate resistance $R_{GON}$. Correspondingly, the IGBT is controlled to enter a non-conducting state by the switch $S_{GON}$ opening and the switch $S_{GOFF}$ connecting the gate terminal G to the negative auxiliary voltage $-U_{G4}$ via gate resistance $R_{GOFF}$.

Figure 3:
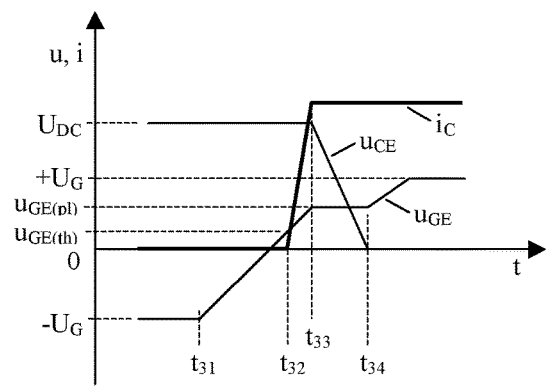
FIG. 3 shows curves associated with controlling the IGBT to enter a conducting state.

FIG. 3 shows characteristic curves associated with controlling an IGBT to enter a conducting state. Before time $t_{31}$, the IGBT is in a non-conducting state, wherein the entire voltage $U_{DC}$ of the intermediate circuit is connected across it ($u_{CE}$), the current thereof ($i_C$) is 0 and the gate voltage $u_{GE}$ is at the level of the negative auxiliary voltage $-U_G$. The act of controlling the IGBT to enter a conducting state begins at time $t_{31}$, at which point the gate voltage $u_{GE}$ begins to rise (=switch $S_{GON}$ closes and switch $S_{GOFF}$ opens in the arrangement in FIG. 2). When the gate voltage reaches a threshold voltage level $U_{GE(th)}$ at time $t_{32}$, the IGBT switches to a conducting state, initially functioning in a so-called linear operation region in which current is proportional to gate voltage. When the current has reached the level of a load current (the gate voltage corresponding to which is $u_{GE(pl)}$) at time $t_{33}$, the voltage $u_{CE}$ of the IGBT begins to fall with gradient $du_{CE}/dt$, which is determined by the ability of the control circuit to input current to the gate. In an equilibrium state, the current inputted by the control circuit corresponds to the current flowing through the Miller capacitance $C_{GC}$ in accordance with formula [1], when the control circuit is connected as in FIG. 2:

$$C_{GC} \times du_{CE}/dt = (+U_G - u_{GE(pl)})/R_{GON} \qquad [1]$$

At time $t_{34}$ the voltage of the IGBT reaches a low conducting state level, at which point the current inputted through the Miller capacitance stops and the gate voltage is enabled to rise towards the level of the positive auxiliary voltage $+U_G$.

Figure 4:
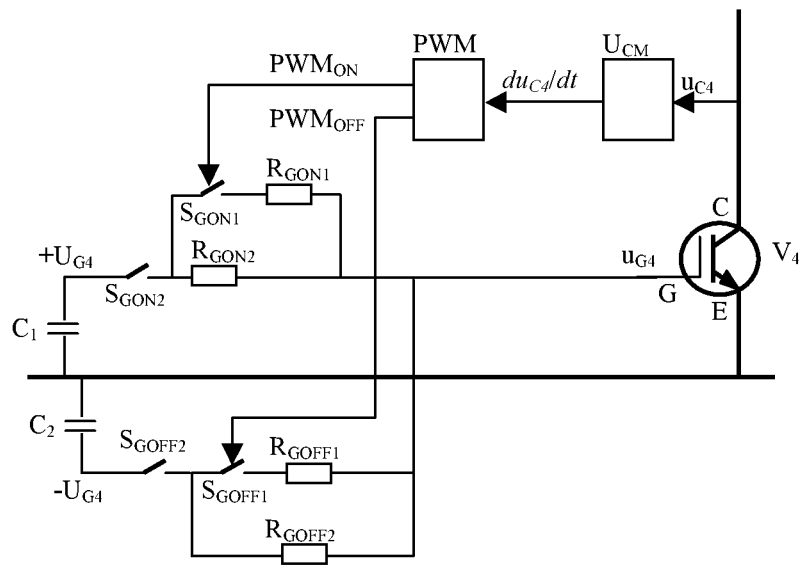
FIG. 4 shows a gate controller solution according to the invention.

FIG. 4 shows an example of the connection arrangement of a gate control circuit according to the invention, comprising first switches ($S_{GON1}$ and $S_{GOFF1}$) and first gate resistances ($R_{GON1}$ and $R_{GOFF1}$) and second switches ($S_{GON2}$ and $S_{GOFF2}$) and second gate resistances ($R_{GON2}$ and $R_{GOFF2}$). The first switches ($S_{GON1}$ and $S_{GOFF1}$) and first gate resistances ($R_{GON1}$ and $R_{GOFF1}$) are in this example connected in parallel with the second gate resistances ($R_{GON2}$ and $R_{GOFF2}$) which correspond to the connection arrangement in FIG. 2. According to the invention, the first switches ($S_{GON1}$ and $S_{GOFF1}$) are controlled with a high frequency of at least 1 MHz by regulating their duty cycle (=the length of time for which the switch is conducting/the entire operating period) according to the rate of change of the voltage measured across the IGBT being controlled (=the voltage between the collector C and the emitter E). In the example of the figure, the collector voltage $u_{C4}$ is measured in a measuring block $U_{CM}$, which forms a signal $du_{C4}/dt$ proportional to the rate of change (i.e. the time derivative) of the collector voltage, from the measurement result, wherein the signal $du_{C4}/dt$ in turn influences, via a regulating block PWM, the duty cycles of signals $PWM_{ON}$ and $PWM_{OFF}$ controlling the abovementioned first switches ($S_{GON1}$ and $S_{GOFF1}$). Thus, by means of the duty cycle of the first switches ($S_{GON1}$ and $S_{GOFF1}$), the value of the gate resistance in use can be adjusted between the ohm values of parallel-connected resistances (e.g. $R_{GON2}$ and $R_{GON1}$ in parallel) and one resistance (e.g. $R_{GON2}$). The resistance value influences the gate current directly, so due to the switch being controlled with a high frequency such as over 1 MHz, the influence of the circuit according to the invention on the gate circuit corresponds in practice to stepless adjustment, by means of duty cycle, of the effective value of the gate resistance $R_{GON}$ according to formula [1] and at the same time also the rate of change $du_{CE}/dt$ of the collector voltage.

As will be clear to those skilled in the art, the first switches ($S_{GON1}$ and $S_{GOFF1}$) and the first gate resistances ($R_{GON1}$ and $R_{GOFF1}$) could also be connected, unlike in the example of FIG. 4, directly in parallel with the series connections formed by the second switches ($S_{GON2}$ and $S_{GOFF2}$) and second gate resistances ($R_{GON2}$ and $R_{GOFF2}$). It is also possible to short-circuit the second switches ($S_{GON2}$ and $S_{GOFF2}$) from the gate circuit and omit the second resistances ($R_{GON2}$ and $R_{GOFF2}$) completely, in which case the effective value of the gate resistance can be adjusted steplessly upwards without limit from minimum values (=the ohm values $R_{GON1}$ and $R_{GOFF1}$ of the first gate resistances), by means of the duty cycle of the first switches ($S_{GON1}$ and $S_{GOFF1}$).

Figure 5:
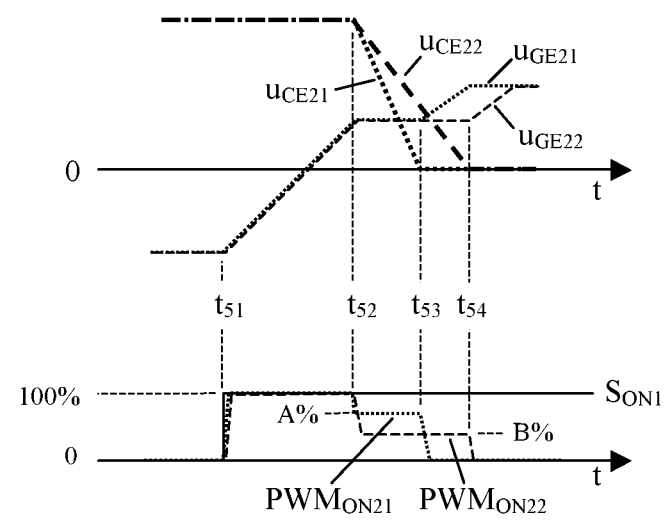
FIG. 5 shows the operation of a gate controller according to the invention.

FIG. 5 shows the characteristic influence of the gate circuit according to the invention when the IGBT is controlled to switch from a non-conducting state to a conducting state. The control situation in the opposite direction, i.e. from a conducting to a non-conducting state, is similar and clear to those skilled in the art, and is therefore not dealt with separately.

The lower part of the figure shows the duty cycle $S_{ON1}$ of a second switch ($S_{GON2}$ in FIG. 4), which changes from zero to 100% at time $t_{51}$ (i.e. the whole switch changes from a non-conducting to a conducting state). Correspondingly, $PWM_{ON21}$ and $PWM_{ON22}$ depict control of a first switch ($S_{GON1}$ in FIG. 4) while $u_{GE21}$ and $u_{GE22}$ depict gate voltages corresponding to these control modes.

In an initial stage of the control situation, in the time period $t_{51} \ldots t_{52}$, the gate voltage of the IGBT rises until the collector voltage begins to fall. To speed up the connection event, it is advantageous for the first switch ($S_{GON1}$) to conduct continuously during this stage, i.e. to operate with a 100% duty cycle until the time $t_{52}$ when the collector voltage changes. When the collector voltage begins to fall at time $t_{52}$, the duty cycle is controlled according to the invention to a value at which the rate of change of the collector voltage is set to a desired value. In the example of the figure, the effective gate resistance at the higher duty cycle A % is smaller than at the lower duty cycle B %, in which case the collector voltage $u_{CE21}$ corresponding to duty cycle A % falls to the conducting state value faster (at time instant $t_{53}$) than the collector voltage $u_{CE22}$ corresponding to duty cycle B % (at time instant $t_{54}$). When the collector voltage has reached the conducting state value, the gate voltage is enabled to rise towards the final level of the auxiliary voltage of the control circuit. Thereafter, the controlling of the first switch has little significance; it can be controlled to return to a continuously conducting state or, as in the example in the figure, the control duty cycle thereof can be lowered to zero.

It will be clear to those skilled in the art that the embodiments of the invention are not limited solely to the examples set out above, but can vary within the framework of the claims which are set out below. An IGBT transistor is used in the description of the invention as an example of a controlled power component, but this does not imply a restriction in application of the invention; rather, it can be applied in the control of power semiconductor switches of other types, such as power MOSFET transistors.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An arrangement for controlling, by means of a voltage signal inputted between gate and emitter terminals (G-E), a switch type power semiconductor component in the form of an IGBT transistor, the arrangement comprising:
   at least one resistance and at least one switch ($R_{GON1}$-$S_{GON1}$, $R_{GOFF1}$-$S_{GOFF1}$) connected in series between an auxiliary voltage (+$U_{G4}$, -$U_{G4}$) of a gate controller and the gate terminal (G) of the IGBT;
   a measuring circuit, adapted to measure a collector voltage between collector and emitter terminals of the IGBT and to form therefrom a signal ($du_{C4}/dt$) proportional to a rate of change of the collector voltage; and
   a signal modification circuit, adapted to control the at least one switch ($S_{GON1}$, $S_{GOFF1}$) connected in series with the at least one resistance with a high frequency of at least 1 MHz, by means of the rate of change ($du_{C4}/dt$) of the collector voltage influencing the duty cycles of control signals ($PWM_{ON}$, $PWM_{OFF}$, $PWM_{ON21}$, $PWM_{ON22}$) of the at least one switch;
   wherein the at least one switch ($S_{GON1}$, $S_{GOFF1}$) and the at least one resistance ($R_{GOFF1}$, $R_{GON1}$) connected in series therewith are connected in parallel with a gate resistance that is connected between the IGBT's gate terminal and the auxiliary voltage of the gate controller all the time that the IGBT is controlled to be in a conducting state and all the time that the IGBT is controlled to be in a non-conducting state.

2. The arrangement according to claim 1, wherein the arrangement further comprises a regulating unit adapted to adjust a duty cycle of a control signal of the at least one switch ($S_{GON1}$, $S_{GOFF1}$) such that the measured rate of change of the collector voltage of the IGBT being controlled is set in accordance with a reference value received from a control unit.

3. The arrangement according to claim 1, wherein the arrangement is adapted to adjust, by means of a duty cycle of a control signal ($PWM_{ON}$, $PWM_{OFF}$, $PWM_{ON21}$, $PWM_{ON22}$) of the at least one switch ($S_{GON1}$, $S_{GOFF1}$), the effective value of the gate resistance substantially steplessly to be greater than an ohm value of the at least one resistance ($R_{GON1}$, $R_{GOFF1}$).

4. The arrangement according to claim 1, wherein the arrangement further comprises second switches ($S_{GON2}$, $S_{GOFF2}$) and second resistances ($R_{GON2}$, $R_{GOFF2}$) connected in series.

5. The arrangement according to claim 4, wherein the at least one switch ($S_{GON1}$, $S_{GOFF1}$) and the at least one resistance ($R_{GON1}$, $R_{GOFF1}$) connected in series are connected in parallel with the second resistances ($R_{GON2}$, $R_{GOFF2}$).

6. The arrangement according to claim 4, wherein the at least one switch ($S_{GON1}$, $S_{GOFF1}$) and the at least one resistance ($R_{GON1}$, $R_{GOFF1}$) connected in series are connected in parallel with series connections formed by the second switches ($S_{GON2}$, $S_{GOFF2}$) and second resistances ($R_{GON2}$, $R_{GOFF2}$).

7. The arrangement according to claim 4, wherein the arrangement is adapted to adjust, by means of duty cycles of control signals ($PWM_{ON}$, $PWM_{OFF}$, $PWM_{ON21}$, $PWM_{ON22}$) of the at least one switch ($S_{GON1}$, $S_{GOFF1}$), the effective value of the gate resistance substantially steplessly between the ohm values of parallel-connected resistances and one resistance.

8. The arrangement according to claim 2, wherein the arrangement is adapted to adjust, by means of a duty cycle of a control signal ($PWM_{ON}$, $PWM_{OFF}$, $PWM_{ON21}$, $PWM_{ON22}$) of the at least one switch ($S_{GON1}$, $S_{GOFF1}$), the effective value of the gate resistance substantially steplessly to be greater than an ohm value of the at least one resistance ($R_{GON1}$, $R_{GOFF1}$).

\* \* \* \* \*